(12) United States Patent
Murphy et al.

(10) Patent No.: US 8,169,003 B2
(45) Date of Patent: May 1, 2012

(54) TERMINATION AND CONTACT STRUCTURES FOR A HIGH VOLTAGE GAN-BASED HETEROJUNCTION TRANSISTOR

(75) Inventors: Michael Murphy, Somerset, NJ (US);
Milan Pophristic, Princeton, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/066,200

(22) Filed: Apr. 7, 2011

(65) Prior Publication Data
US 2011/0215339 A1    Sep. 8, 2011

Related U.S. Application Data

(63) Continuation of application No. 11/725,823, filed on Mar. 20, 2007, now Pat. No. 7,939,853.

(51) Int. Cl.
*H01L 31/072* (2012.01)
*H01L 31/109* (2006.01)
*H01L 31/0328* (2006.01)
*H01L 31/0336* (2006.01)

(52) U.S. Cl. .................. 257/192; 257/76; 257/188

(58) Field of Classification Search ............ 257/76, 257/188, 192, E29.246
See application file for complete search history.

(56) References Cited

U.S. PATENT DOCUMENTS

| | | | |
|---|---|---|---|
| 3,775,200 A | 11/1973 | De Nobel et al. | |
| 4,543,595 A | 9/1985 | Vora | |
| 4,745,445 A | 5/1988 | Mun et al. | |
| 4,946,547 A | 8/1990 | Palmour et al. | |
| 5,200,022 A | 4/1993 | Kong et al. | |
| 5,602,418 A | 2/1997 | Imai et al. | |
| 5,612,567 A | 3/1997 | Baliga | |
| 5,686,738 A | 11/1997 | Moustakas | |
| 5,741,724 A | 4/1998 | Ramdani et al. | |
| 5,785,606 A | 7/1998 | Marquez | |
| 5,874,747 A | 2/1999 | Redwing et al. | |
| 5,877,558 A | 3/1999 | Nakamura et al. | |
| 6,051,340 A | 4/2000 | Kawakami et al. | |
| 6,121,121 A | 9/2000 | Koide | |
| 6,139,628 A | 10/2000 | Yuri et al. | |
| 6,146,457 A | 11/2000 | Solomon | |
| 6,184,570 B1 | 2/2001 | MacDonald, Jr. et al. | |

(Continued)

FOREIGN PATENT DOCUMENTS

EP    0081414    6/1983
(Continued)

OTHER PUBLICATIONS

Arulkumaran S et al: Studies on the Influences of i-GaN, n-GaN, p-GaN and InGaN Cap Leyers in AlGaN/GaN High-Electron-Mobility.

(Continued)

*Primary Examiner* — Phuc Dang
(74) *Attorney, Agent, or Firm* — The Law Offices of Bradley J. Bereznak

(57) ABSTRACT

A semiconductor device is provided that includes a substrate, a first active layer disposed over the substrate, and a second active layer disposed on the first active layer. The second active layer has a higher bandgap than the first active layer such that a two-dimensional electron gas layer arises between the first active layer and the second active layer. A termination layer, which is disposed on the second active layer, includes InGaN. Source, gate and drain contacts are disposed on the termination layer.

23 Claims, 3 Drawing Sheets

U.S. PATENT DOCUMENTS

| | | | |
|---|---|---|---|
| 6,239,033 B1 | 5/2001 | Kawai |
| 6,331,450 B1 | 12/2001 | Uemura |
| 6,344,665 B1 | 2/2002 | Sung et al. |
| 6,380,108 B1 | 4/2002 | Linthicum et al. |
| 6,389,051 B1 | 5/2002 | Van de Walle |
| 6,432,579 B1 | 8/2002 | Tsuji et al. |
| 6,437,374 B1 | 8/2002 | Northrup et al. |
| 6,492,669 B2 | 12/2002 | Nakayama et al. |
| 6,507,041 B2 | 1/2003 | Nakamura et al. |
| 6,524,900 B2 | 2/2003 | Dahlqvist et al. |
| 6,573,537 B1 | 6/2003 | Steigerwald et al. |
| 6,586,777 B1 | 7/2003 | Yuasa et al. |
| 6,586,781 B2 | 7/2003 | Wu et al. |
| 6,593,597 B2 | 7/2003 | Sheu |
| 6,605,854 B2 | 8/2003 | Nagase et al. |
| 6,608,327 B1 | 8/2003 | Davis et al. |
| 6,610,995 B2 | 8/2003 | Nakamura et al. |
| 6,624,444 B1 | 9/2003 | Li |
| 6,627,967 B2 | 9/2003 | Asano et al. |
| 6,649,995 B2 | 11/2003 | Tooi et al. |
| 6,656,823 B2 | 12/2003 | Lee et al. |
| 6,685,804 B1 | 2/2004 | Ikeda et al. |
| 6,768,146 B2 | 7/2004 | Yoshida |
| 6,855,970 B2 | 2/2005 | Hatakeyama et al. |
| 6,949,401 B2 | 9/2005 | Kaminski et al. |
| 6,949,774 B2 | 9/2005 | Parikh et al. |
| 7,026,665 B1 | 4/2006 | Smart et al. |
| 7,115,896 B2 | 10/2006 | Gao et al. |
| 7,229,866 B2 | 6/2007 | Zhu et al. |
| 7,235,330 B1 | 6/2007 | Fujimoto et al. |
| 7,253,015 B2 | 8/2007 | Pophristic et al. |
| 7,323,402 B2 | 1/2008 | Chiola |
| 7,547,928 B2 | 6/2009 | Germain et al. |
| 7,696,540 B2 | 4/2010 | Francis |
| 7,696,598 B2 | 4/2010 | Francis |
| 2002/0015833 A1 | 2/2002 | Takahashi et al. |
| 2003/0015708 A1 | 1/2003 | Parikh et al. |
| 2003/0098462 A1 | 5/2003 | Yoshida |
| 2004/0016965 A1* | 1/2004 | Ui et al. ............... 257/335 |
| 2004/0119063 A1 | 6/2004 | Guo et al. |
| 2005/0179106 A1 | 8/2005 | Asano et al. |
| 2006/0108606 A1* | 5/2006 | Saxler et al. ............ 257/200 |
| 2006/0151868 A1 | 7/2006 | Zhu et al. |
| 2006/0186422 A1* | 8/2006 | Gaska et al. ............ 257/96 |
| 2006/0244010 A1 | 11/2006 | Saxler |
| 2009/0191674 A1 | 7/2009 | Germain et al. |

FOREIGN PATENT DOCUMENTS

| | | |
|---|---|---|
| EP | 0514018 | 11/1992 |
| EP | 1 612 866 A2 | 1/2006 |
| EP | 1643561 | 4/2006 |
| FR | 2844099 | 3/2004 |
| JP | 11040847 | 2/1992 |
| JP | 08050922 | 2/1996 |
| JP | 09306504 | 11/1997 |
| JP | 11135115 | 5/1999 |
| JP | 11145514 | 5/1999 |
| JP | 2001357855 | 12/2001 |
| JP | 2002083594 | 3/2002 |
| JP | 2004186558 | 7/2004 |
| JP | 2005209377 | 8/2005 |
| JP | 2005317843 | 11/2005 |
| JP | 2006155959 | 6/2006 |
| WO | 9641906 | 12/1996 |
| WO | 0131722 | 5/2001 |
| WO | 0143174 | 6/2001 |

OTHER PUBLICATIONS

Transistors, Japanese Journal of Applied Physics, Japan Society of Applied Physics, JP, vol. 44, No. %A, May 10, 2005, pp. 2953-2960. XP001502490, ISSN: 0021-4922, DOI: DOI:10.1143/JJAP.44.2953, 2005.

* cited by examiner

US 8,169,003 B2

TERMINATION AND CONTACT STRUCTURES FOR A HIGH VOLTAGE GAN-BASED HETEROJUNCTION TRANSISTOR

RELATED APPLICATIONS

This application is a continuation of application no. 11/725,823 filed Mar. 20, 2007, now U.S. Pat. No. 7,939,853, which application is assigned to the assignee of the present application. This application is related to copending U.S. patent application Ser. No. 11/725,760, entitled "Cascode Circuit Employing A Depletion-Mode, GaN-Based Fet," filed on Mar. 20, 2007 and herein incorporated by reference in its entirety herein.

This application is also related to U.S. patent application Ser. No. 11/725,820, entitled "High-Voltage GaN-Based Heterojunction Transistor Structure and Method of Forming Same," filed on Mar. 20, 2007 and herein incorporated by reference in its entirety herein.

FIELD OF THE INVENTION

The present invention relates to a high voltage transistor heterostructure, and more particularly relates to a high voltage gallium nitride (GaN) high electron mobility transistor (HEMT).

BACKGROUND OF THE INVENTION

Gallium nitride (GaN) offers substantial opportunity to enhance performance of electronic devices such as high electron mobility transistors (HEMTs). The HEMT behaves much like a conventional Field Effect Transistor (FET), and the fabrication of HEMT devices is based on FET architecture. However, HEMTs require a very precise, lattice-matched heterojunction between two compound semiconductor layers. In general, a GaN HEMT has a Schottky layer and a GaN buffer layer deposited on a substrate and source, gate, and drain contacts deposited on the Schottky layer.

The GaN-based HEMT device is capable of maximizing electron mobility by forming a quantum well at the heterojunction interface between the AlGaN layer, which has a large band gap, and the GaN layer, which has a narrower band gap. As a result, electrons are trapped in the quantum well. The trapped electrons are represented by a two-dimensional electron gas in the undoped GaN layer. The amount of current is controlled by applying voltage to the gate electrode, which is in Schottky contact with the semiconductors so that electrons flow along the channel between the source electrode and the drain electrode.

As the market for HEMTS continues to grow, many improvements remain desirable to enhance various operating characteristics such as the breakdown voltage Vbr and the leakage current I. For example, one problem that remains to be adequately addressed arises because the Schottky layer is typically metallic and may be exposed to air during fabrication of the HEMT and/or during operation of the HEMT. By exposing the Schottky layer to air, surface reactions such as oxidation may occur on the surface of the Schottky layer. These surface reactions may degrade the performance of the HEMT and also decrease the effectiveness of passivation. Passivation is the deposition of a dielectric material on the surface of the HEMT in order to passivate, or fill, surface traps on the surface of the HEMT, thereby avoiding device degradation due to these surface traps such as RF to DC dispersion.

Therefore, there remains a need for a high voltage GaN HEMT structure that, among other things, has a reproducible termination layer capable of preventing surface reactions during fabrication and operation of the GaN HEMT.

SUMMARY OF THE INVENTION

In accordance with the present invention, a semiconductor device is provided that includes a substrate, a first active layer disposed over the substrate, and a second active layer disposed on the first active layer. The second active layer has a higher bandgap than the first active layer such that a two-dimensional electron gas layer arises between the first active layer and the second active layer. A termination layer, which is disposed on the second active layer, includes InGaN. Source, gate and drain contacts are disposed on the termination layer.

In accordance with one aspect of the invention, the first active layer comprises a group III nitride semiconductor material. the first active layer comprises GaN.

In accordance with another aspect of the invention, the second active layer comprises a group III nitride semiconductor material.

In accordance with another aspect of the invention, the second active layer comprises $Al_xGa_{1-x}N$, wherein $0<x<1$.

In accordance with another aspect of the invention, the second active layer is selected from the group consisting of AlGaN, AlInN, and AlInGaN.

In accordance with another aspect of the invention, a nucleation layer is disposed between the substrate and the first active layer.

In accordance with another aspect of the invention, a semiconductor device includes a substrate, a first active layer disposed over the substrate, and a second active layer disposed on the first active layer. The second active layer has a higher bandgap than the first active layer such that a two-dimensional electron gas layer arises between the first active layer and the second active layer. A termination layer is disposed on the second active layer. The termination layer is selected from the group consisting of Fe-doped GaN, Si-doped GaN, FeN and SiN. Source, gate and drain contacts are disposed on the termination layer.

In accordance with another aspect of the invention, a semiconductor device includes a substrate, a first active layer disposed over the substrate, and a second active layer disposed on the first active layer. The second active layer has a higher bandgap than the first active layer such that a two-dimensional electron gas layer arises between the first active layer and the second active layer. The second active layer includes first and second recesses formed therein. A source and drain contact are disposed in the first and second recesses, respectively. A gate electrode is disposed over the second active layer.

DETAILED DESCRIPTION

It is worthy to note that any reference herein to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment. Moreover, the various embodiments may be combined in a multiplicity of ways to yield additional embodiments that are not explicitly shown herein.

Figure 1:
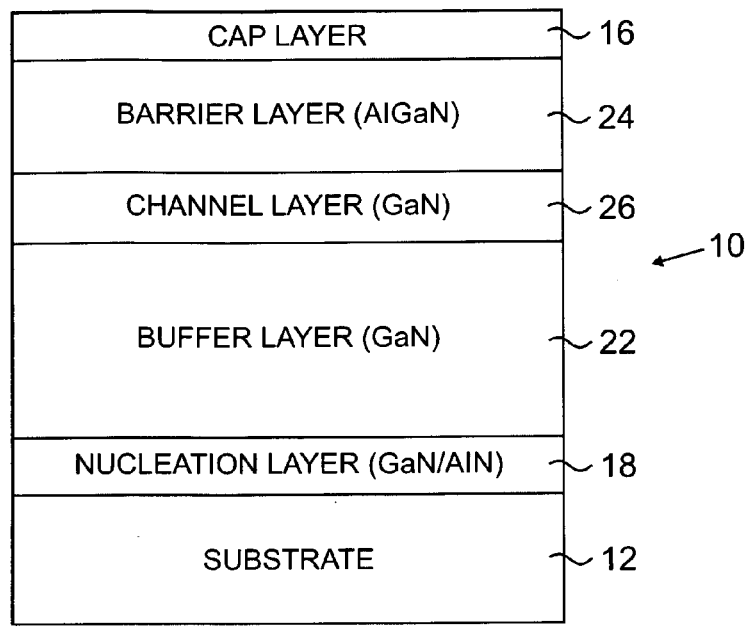
FIG. 1 shows one embodiment of a gallium nitride (GaN) heterojunction structure incorporated in a high electron mobility transistor (HEMT).

The present invention relates to a high voltage, gallium nitride (GaN) heterojunction structure incorporated in a high electron mobility transistor (HEMT) 10 as illustrated in FIG. 1. The HEMT 10 includes a substrate 12, a nucleation (transitional) layer 18, a GaN buffer layer 22, an aluminum gallium nitride ($Al_xGa_{1-x}N$; 0<X<1) Schottky layer 24, and a cap or termination layer 16. Further, the HEMT 10 includes source contact 27, gate contact 28, and drain contact 30.

The GaN heterojunction structure 10 is typically fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate 302. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD).

To begin the growth of the structure, the nucleation layer 18 is deposited on the substrate 12. The substrate 12 may be formed from various materials including, but not limited to, sapphire or silicon carbide (SiC). The nucleation layer 18 may be, for example, an aluminum rich layer such as $Al_xGa_{1-x}N$, where X is in the range 0 to 1. The nucleation layer 18 operates to correct a lattice mismatch between the GaN buffer layer 22 and the substrate 12. In general, a lattice mismatch is created when the spacing between atoms of one layer does not match the spacing between the atoms of an adjacent layer. As a result of the lattice mismatch, bonding between the atoms of the adjacent layers are weak, and the adjacent layers could crack, separate, or have a large number of crystalline defects. Therefore, the nucleation layer 18 operates to correct the lattice mismatch between the GaN buffer layer 22 and the substrate 12 by creating an interface between the crystalline structure of the substrate 12 and the crystalline structure of the GaN buffer layer 22.

After depositing the nucleation layer 18, the GaN buffer layer 22 is deposited on the nucleation layer 18, and the $Al_xGa_{1-x}N$ Schottky layer 24 is deposited on the GaN buffer layer 22. The two-dimensional conduction channel 26, which is a thin, high mobility channel, confines carriers to an interface region between the GaN buffer layer 22 and the $Al_xGa_{1-x}N$ Schottky layer 24. The cap or termination layer 16 is deposited on the $Al_xGa_{1-x}N$ Schottky layer 24 and serves to protect the $Al_xGa_{1-x}N$ Schottky layer 24 from surface reactions, such as oxidation, during fabrication and operation of the HEMT 10. Because the Schottky layer 24 includes aluminum, oxidation occurs if the $Al_xGa_{1-x}N$ Schottky layer 24 is exposed to air and is not otherwise protected.

After growth of the epitaxial layers 18, 22 and 24 and the termination layer 16 on the substrate 12, the HEMT 10 is completed by depositing the source, gate, and drain contacts 27, 28, and 30, respectively, on the termination layer 16. Each of the contacts 27, 28, and 30 are metallic contacts. Preferably, the gate contact 28 is a metallic material such as but not limited to nickel, gold, and the source and drain contacts 27 and 30, are each a metallic material such as but not limited to titanium, gold, or aluminum.

In one embodiment of the invention the termination layer 16 is an InGaN layer that is formed on the $Al_xGa_{1-x}N$ Schottky layer 24. The InGaN layer 16 serves two purposes, the first of which is to provide an upper layer that does not include Al so that oxidation is reduced. Moreover, by using an InGaN material instead of a material that includes Al, the growth process may be simplified since Al-containing compounds such as InGaAlN generally require higher growth temperatures to provide adequate uniformity and smoothness. In addition, the InGaN layer 24 slightly lowers the potential barrier at the surface, which can reduce the build up of surface charges and reduce the leakage current on the surface of the structure.

In another embodiment of the invention the termination layer 16 is a flash layer comprising Al metal. A flash layer is formed with a very short burst of material. This will form a very thin (e.g., 1-2 monolayers of material) but even coverage over the structure's surface. The flash layer is generally performed in situ. To ensure that metallic Al is formed and not AlN, the reactive nitrogen-containing gas (e.g., ammonia) that would otherwise be present when forming AlN is absent. The Al flash layer may be formed at high or low temperatures. After its formation, the Al can be subsequently annealed to form a thin oxide layer. Since the Al flash layer is very thin, it can be oxidized in its entirety, thus creating an initial "native" oxide on the material which then protects the Schottky layer 24 from undergoing any degradation of the type that is often seen in processing. This can also act as an additional barrier material for reduction of leakage currents and increase in breakdown voltage, both of which are important to HEMT performance. Instead of Al, the flash layer may comprise other metals such as gallium or even indium. The Ga or In flash layer can also be oxidized to form a uniform "native" oxide on the structure.

In yet other embodiments of the invention the cap or termination layer 16 may be formed from other materials such as highly Fe doped GaN, Si doped GaN, FeN or SiN. These layers, which may be epitaxial, nonepitaxial or even amorphous, can serve as initial passivation layers or as additional barrier materials to reduce leakage currents and increase breakdown voltages. For instance, the addition of Fe to GaN results in a material that can reduce the leakage current because the material is more insulating and reduces electron mobility.

In other embodiments of the invention, a thin AlN layer may be formed on the $Al_xGa_{1-x}N$ Schottky layer 24. This layer provides an additional Schottky barrier layer to help modulate the charge more efficiently, thus reducing the leakage current and increasing the breakdown voltage of the device. The AlN layer may also serve as an initial passivation layer for the structure, since the AlN can be easily wet etched to deposit ohmic contacts. Alternatively, the AlN layer may be oxidized to form a passivation layer.

In some embodiments, the termination layer 16 is approximately 1 to 5 nanometers thick. Therefore, electrons can easily tunnel through the termination layer 16. As a result, the termination layer 16 does not increase the Schottky barrier height between the gate contact 28 and the $Al_xGa_{1-x}N$ Schottky layer 24, where the Schottky barrier height defines a potential energy barrier encountered by electrons at the interface of the gate contact 28 and the $Al_xGa_{1-x}N$ Schottky layer 24. Further, the termination layer 16 does not affect the formation of the source and drain contacts 27 and 30.

Figure 2:
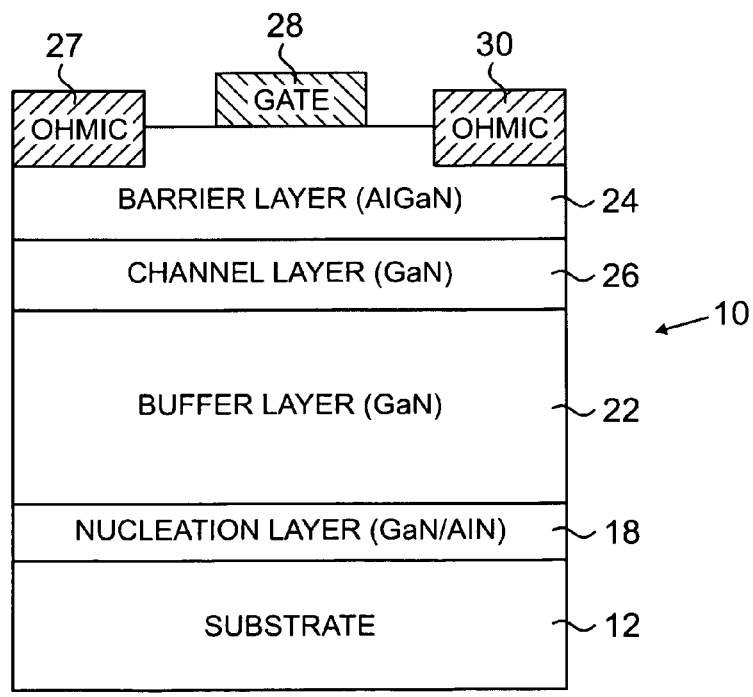
FIGS. 2 and 3 show alternative embodiments of a gallium nitride (GaN) heterojunction structure incorporated in a high electron mobility transistor (HEMT).
Figure 4:
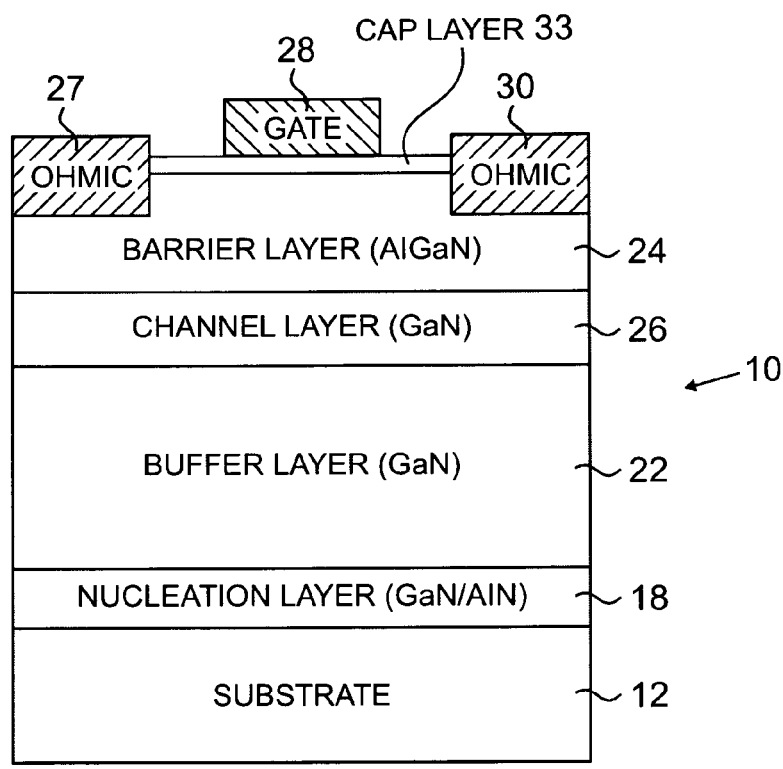
FIG. 4 shows another alternative embodiment of a gallium nitride heterojunction structure incorporated in a high electron mobility transistor (HEMT).

FIG. 2 shows yet another embodiment of the invention in which the ohmic contacts 27 and 30 are located in recesses formed in the $Al_xGa_{1-x}N$ Schottky layer 24. The recesses are formed by etching the $Al_xGa_{1-x}N$ Schottky layer 24 in accordance with conventional techniques. The recesses may extend partially or completely through the $Al_xGa_{1-x}N$ Schottky layer 24. For instance, in some cases the recess may extend to a depth of about 5 to 15 nm deep, thereby allowing a sufficient thickness of the $Al_xGa_{1-x}N$ Schottky layer 24 to remain to create the channel layer 26. By recessing the contacts in this manner the contact resistivity and the smoothness of the surface is reduced to increase the penetration of the metals deposited to form the ohmic contact. The increased surface roughness results in better metal migration into the semiconductor). For devices requiring low on-resistance, this arrangement can be significant in achieving the lowest possible on-resistance. As shown in FIG. 4, this embodiment of the invention may also employ a cap or termination layer such as those discussed above. In this case the recesses in which the contacts 27 and 30 are located will also extend through the termination layer.

Figure 3:
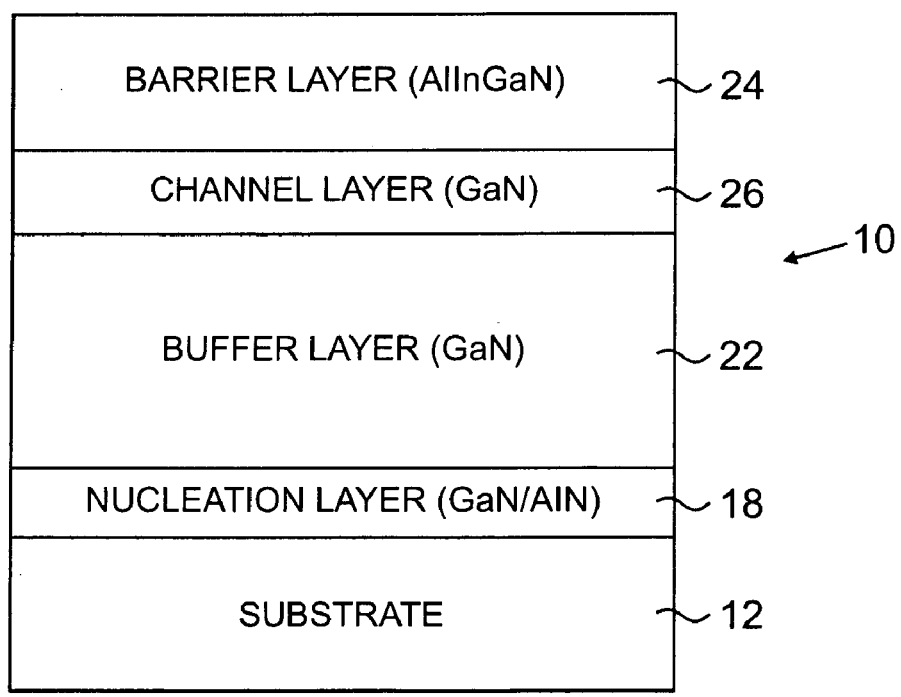

FIG. 3 shows another embodiment of the invention in which the barrier layer 24 is formed from AlInGaN instead of $Al_xGa_{1-x}N$. For instance, as discussed in M. Asif Khan et al., "Strain Energy Band Engineering in AlGaInN/GaN Heterostructure Field Effect Transistors," GAAS99, $Al_xIn_yGa_{(1-x-y)}N$ junctions are employed which have a barrier thickness less than 50 nm with alloy compositions that vary from x equals 0.1 to 0.2 and y equals 0.00 to 0.02). Furthermore, Khan et al. states that an Al/In ratio of 5 should be nearly lattice matched to GaN, based on a linear interpolation of lattice constants. By using AlInGaN the strain can be controlled independently of the bandgap, thereby allowing the bandgap of the material to be altered with more freedom in regards to critical thickness. For power devices this can be critical to obtain the most charge in the channel without unduly stressing the material and reducing device lifetime, which might otherwise occur as the material relaxes over time.

Although various embodiments are specifically illustrated and described herein, it will be appreciated that modifications and variations of the present invention are covered by the above teachings and are within the purview of the appended claims without departing from the spirit and intended scope of the invention. For example, while the depletion mode FET has been described as a GaN-based device, the invention more generally encompasses a depletion mode FET that is formed from any Group III nitride compound semiconductor in which the group III element may be gallium (Ga), aluminum (Al), boron (B) or indium (In).

The invention claimed is:

1. A semiconductor device comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a layer disposed on the second active layer to passivate a surface of the semiconductor device, the layer including InGaN;
a gate contact disposed on top of the layer; and
a source ohmic contact and a drain ohmic contact respectively disposed in first and second recesses that each extend through the layer into the second active layer.

2. The semiconductor device according to claim 1, wherein the first active layer comprises a group III nitride semiconductor material.

3. The semiconductor device according claim 2, wherein the first active layer comprises GaN.

4. The semiconductor device according to claim 1, wherein the second active layer comprises a group III nitride semiconductor material.

5. The semiconductor device according to claim 4, wherein the second active layer comprises $Al_xGa_{1-x}N$, wherein 0<X<1.

6. The semiconductor device according to claim 4, wherein the second active layer is selected from the group consisting of AlGaN, AlInN, and AlInGaN.

7. The semiconductor device according to claim 1 further comprising a nucleation layer disposed between the substrate and the first active layer.

8. A semiconductor device, comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a layer disposed on the second active layer to passivate a surface of the semiconductor device, the layer being selected from the group consisting of Fe-doped GaN, Si-doped GaN, FeN and SiN;
a gate contact disposed on top of the layer; and
a source ohmic contact and a drain ohmic contact respectively disposed in first and second recesses that each extend through the layer into the second active layer.

9. The semiconductor device according to claim 8, wherein the first active layer comprises a group Ill nitride semiconductor material.

10. The semiconductor device according claim 9, wherein the first active layer comprises GaN.

11. The semiconductor device according to claim 8, wherein the second active layer comprises a group III nitride semiconductor material.

12. The semiconductor device according to claim 11, wherein the second active layer comprises $Al_xGa_{1-x}N$, wherein 0<X<1.

13. The semiconductor device according to claim 11, wherein the second active layer is selected from the group consisting of AlGaN, AlInN, and AlInGaN.

14. The semiconductor device according to claim 8 further comprising a nucleation layer disposed between the substrate and the first active layer.

15. A semiconductor device comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a layer disposed on the second active layer to passivate a surface of the semiconductor device, the layer comprising a flash layer;
a gate contact disposed on top of the layer; and
a source ohmic contact and a drain ohmic contact respectively disposed in first and second recesses that each extend through the layer into the second active layer.

16. The semiconductor device according to claim 15 wherein the flash layer comprises Al without a N component.

17. The semiconductor device according to claim 15 wherein the flash layer comprises Ga.

18. The semiconductor device according to claim 15 wherein the flash layer comprises In.

19. A high electron mobility transistor (HEMT) comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a plurality of layers disposed on the second active layer to passivate a surface of the HEMT, the layers comprising a GaN layer;
a gate contact disposed on a top of the layers;
a source ohmic contact and a drain ohmic contact respectively disposed in first and second recesses that each extend through the layers into the second active layer.

20. The HEMT according to claim 19 wherein the GaN layer comprises Fe doped GaN.

21. The HEMT according to claim 19 wherein the GaN layer comprises Si doped GaN.

22. The HEMT according to claim 19 wherein the layers further comprise FeN.

23. The HEMT according to claim 19 wherein the layers further comprise SiN.

* * * * *